United States Patent [19]
Khoury

[11] Patent Number: 5,912,898
[45] Date of Patent: Jun. 15, 1999

[54] CONVOLUTIONAL INTERLEAVER/DE-INTERLEAVER

[75] Inventor: George Khoury, Santa Clara, Calif.

[73] Assignee: Integrated Device Technology, Inc., Santa Clara, Calif.

[21] Appl. No.: 08/810,173

[22] Filed: Feb. 27, 1997

[51] Int. Cl.[6] .......................... H03M 13/22; H03M 13/00
[52] U.S. Cl. ........................... 371/2.1; 371/2.2; 371/38.1
[58] Field of Search .................................. 371/39.1, 38.1, 371/2.1, 2.2

[56] References Cited

U.S. PATENT DOCUMENTS

| | | | |
|---|---|---|---|
| 5,042,033 | 8/1991 | Costa | 371/2.1 |
| 5,396,518 | 3/1995 | How | 375/265 |
| 5,408,502 | 4/1995 | How | 375/340 |
| 5,442,646 | 8/1995 | Chadwick et al. | 371/43 |
| 5,497,401 | 3/1996 | Ramaswamy et al. | 375/341 |
| 5,508,748 | 4/1996 | Krishnamurthy et al. | 348/475 |
| 5,537,420 | 7/1996 | Huang | 371/2.1 |
| 5,572,532 | 11/1996 | Fimoff et al. | 371/2.2 |

*Primary Examiner*—Stephen M. Baker
*Attorney, Agent, or Firm*—Wilson, Sonsini, Goodrich & Rosati

[57] ABSTRACT

An adaptable, programmable convolutional interleaving and de-interleaving system uses less space in an integrated circuit than prior art techniques, and is scalable for wide variety of values of I and M. The coder comprises a coder input receiving a stream of data in time with a clock, the stream of data being supplied in units of data such as bytes, and a coder output which supplies the interleaved or de-interleaved data. A single port RAM having an address input, a data input coupled to the coder input, and a data output coupled to the coder output is included. An address generator is coupled with the clock, and supplies a sequence of addresses to the address input in time with the clock. The sequence of addresses implements a convolutional pattern having cells with a depth equal to M units of data and having a number of rows I+1. Each row, based on an index i going from 0 to 1, includes i cells. Programmable memory is coupled to the address generator that stores a value specifying the depth M, and a value specifying the number of rows I. Logic is responsive to the stored values for M and I to generate the sequence of addresses. The convolutional pattern executed by the address generator can be either an interleaving pattern or a de-interleaving pattern as suits the needs of a particular implementation.

30 Claims, 7 Drawing Sheets

5,912,898

CONVOLUTIONAL INTERLEAVER/DE-INTERLEAVER

BACKGROUND OF THE INVENTION

1. Field of the Invention

Present invention relates to encoders and decoders for communication channels, and more particularly to convolutional interleavers and de-interleavers which are used in communication channels for the purposes of reducing the effect of burst-type errors in communication channels.

2. Description of Related Art

In data communication channels, one technique for managing errors is based on error correction and detection codes, such as the Reed-Solomon encoding and decoding techniques. According to these error correction and detection coding techniques, the data stream is transformed into a sequence of error protected packets of data. Errors which occur within the error protected packets, can be detected and in many cases corrected.

The error correcting and detecting codes in common use are very good at detecting and correcting isolated bit errors which occur in a communication channel. However, in a channel which is subject to burst-type errors, that is errors which will affect a large number of bits of data at a time, typical error correction and detection codes are insufficient. Burst-type errors often occur because of disturbances in the transmission path. Convolutional interleaving and de-interleaving techniques on either end of the transmission path are used to interleave the packet data so that the effects of burst errors become distributed when the packet data is de-interleaved, and do not overwhelm the error correcting and detecting codes.

For example, an emerging telecommunications standard for digital broadcasting systems for television, sound and data service is under development by the European Telecommunications Standards Institute (ETSI). This standard known as ETS300 412, published December 1994 specifies a system for performing the adaptation of base band television signals based on transport multiplex adaptation and randomization for energy dispersal; outer coding based on Reed-Solomon coding, convolutional interleaving, inner-coding based on punctured convolutional codes or Viterbi coding, base band shaping for modulation and actual modulation. The system includes a Reed-Solomon error correction and detection code, and convolutional interleaving to randomize error bursts on a byte basis in order to improve the burst error correction capability of the Reed-Solomon coder.

FIGS. 1 and 2 illustrate convolutional interleaving and de-interleaving respectively. In convolutional interleaving, as shown in FIG. 1, the interleaver comprises a number I+1 of rows, as shown as rows 0 through I in the FIG. 1. The rows after the first row consist of a first-in and first-out FIFO buffer having a number of cells which have a depth of M units of data. First row, Row 0 has 0 cells. The second row, Row 1 has one M unit cell and so on until the last row, Row I includes I M unit cells in the FIFO. An error protected packet enters the interleaver from the left in FIG. 1. The first byte of the error protected packet is supplied to Row 0. The second byte of the error protected packet is supplied to Row 1, and so on. On the output, the data is read from the outputs of the FIFOs in a counter-clockwise kind of rotation. Thus, the first byte is read from Row 0, the second byte is read from the output of the FIFO in Row 1, the second byte is read from the output of FIFO in Row 2, and so on until the last byte is read from the output of the FIFO in Row I for a given cycle through the interleaver output.

Considering a simple case in which I+1 is 3 (I=2), and M is 1, considering where the FIFOs are all initialized to zero, in a first clock cycle, the first byte is supplied on Row 0 directly through to the output. The second byte is stored in the FIFO in row 1, and 0 is supplied to the output at Row 1. The third byte is stored to the FIFO in Row 2, and 0 is supplied to the output at Row 2. The fourth byte is supplied directly from the input at Row 0 to the output. The fifth byte is stored in the FIFO in Row 1, and the second byte is read from the FIFO in Row I as output. The sixth byte is read to the FIFO at Row 2, and 0 is supplied at the output of Row 2. The seventh byte is supplied directly across Row 0. The eighth byte is supplied to the FIFO in Row 1, and the fourth byte is read from the FIFO in Row 1. The ninth byte is supplied to the FIFO in Row 2, and the third byte is read from the output of FIFO in Row 2, and so on. Therefore, for the input 1, 2, 3, 4, 5, 6, 7, 8, 9, . . . the output generated is 1 0 0 4 2 0 7 5 3 . . .

FIG. 2 illustrates the convolutional de-interleaver. The de-interleaver has a structure which is symmetrical with that of the interleaver. Thus, the first row of the de-interleaver has a FIFO with I cells which are M units deep. The last row, Row I, has no cells. The next to last row, I–1 has one cell in FIFO, and so on in the Figure. The de-interleaver receives the interleaved data on the left and writes it into the FIFOs in a clockwise right rotation as before. Thus, for the input 1 0 0 4 2 0 7 5 3 10 8 6 . . . which is generated by the interleaver, when I+1=3 and M=1, the first byte "1" is supplied into the FIFO at Row 0 and the output is zero, where in this embodiment Row 0 corresponds to the Row I–2 in FIG. 2. Second byte, "0", is supplied to the FIFO in Row I–1 and zero is output. The third byte "0" is supplied directly through Row I. The fourth byte "4" is supplied to the FIFO in Row I–2 and zero is output. The fifth byte "2" is supplied to the FIFO at Row I–1 and zero is output, and the sixth byte "0" is supplied directly through row I to the output. The seventh byte "7" is written to the FIFO in Row I–2, and the first byte "1" is supplied to as output. The eighth byte "5" is supplied to the FIFO in Row I–1, and the second byte "2" is supplied as output. The ninth byte "3" is supplied directly across from Row I, and so on.

The output pattern is 0 0 0 1 2 3 4 5 6 . . . .

Conceptually, the convolutional interleaver and de-interleaver of FIGS. 1 and 2 can be implemented by physical shift registers having the specified lengths. However, an exact hardware implementation of this architecture is very inefficient in terms of silicon area and gate count.

A more preferred method in the prior art is shown in FIG. 3. The system includes a memory 10, which is connected to receive addresses for read or write accesses to the memory across line 11. The address on line 11 is supplied by address select logic 12. The address select logic is connected to circuitry which provides address control for each of the separate virtual FIFOs set up in the memory 10. Thus, the first FIFO is implemented by a counter 13 for Row 0, which applies the address for Row 0 on line 14. A counter 15 for Row 1 is added by adder 16 to an offset 17 to generate an address for the FIFO in Row 1 on line 18. In similar fashion, a counter 19 for Row 2, and an offset for the FIFO of Row 2 on line 20 are supplied to adder 21 which supplies an address on line 22 for the FIFO of Row 2. A counter 23 and an offset 24 for the row where I=3, are supplied to an adder 25 to generate an address on line 26 for the row where I=3. Finally, for the row I, a counter 27 and an offset 28 are supplied to an adder 29 to generate the address on line 30 for the last FIFO row. Control logic 31 keeps track of the read and write process and controls the address select logic 12 with signals on line 32.

Thus, virtual FIFOs are implemented in single or dual port RAM. The read and write addresses with proper offsets are generated with separate adders for each row. While this technique is useful, and improves over the standard FIFO approach, the hardware implementation of the architecture becomes inefficient as the number of FIFOS, based on the I parameter, increases. Furthermore, the implementation is not configurable with various M and I variables, but rather these values determine the number of counters needed and the width of the adders. Finally, separate address generators are needed for the interleave and de-interleave directions.

Thus, it is desirable to provide an interleaver/de-interleaver architecture for use in the encoding and decoding of communication channels which has a scalable architecture for increasing complexity of the interleaver and de-interleaver algorithm, and utilizes less space on integrated circuits using the technique.

SUMMARY OF THE INVENTION

The present invention provides an adaptable, programmable convolutional interleaving and de-interleaving system which uses less integrated circuit space than prior art techniques, and is scalable for wide variety of values of I and M. Thus, the invention can be characterized as an apparatus for convolutional coding of a stream of data. The apparatus comprises a coder input receiving a stream of data in time with a clock, the stream of data being supplied in units of data such as bytes. The apparatus includes a coder output which supplies the interleaved or de-interleaved data. A memory having an address input, a data input coupled to the coder input, and a data output coupled to the coder output is included. The memory is a single port RAM or other memory structure, which supports a read-modify-write operation in time with the clock. A memory bypass path is included for rows having no cells (the first row in interleave and the last row in de-interleave). The read-modify-write operation operates at a memory location identified by an address on the address input to supply a unit of data read from the memory location to the data output, and to supply a unit of data from the data input to the memory location. An address generator is coupled with the clock, and supplies a sequence of addresses to the address input in time with the clock. The sequence of addresses implements a convolutional pattern having cells with a depth equal to M units of data and having a number I+1 of rows. Each row includes i cells, based on an index i going from 0 to I. The apparatus includes programmable memory which is coupled to the address generator that stores a value indicating the depth M of the cells and a value indicating the number I. Logic is responsive to the stored values for M and I to generate the sequence of addresses. According to this characterization of the invention, the convolutional pattern executed by the address generator can be either an interleaving pattern or a de-interleaving pattern as suits the needs of a particular implementation, and in one embodiment can be changed on the fly from an interleaver to a de-interleaver as traffic dictates.

According to another aspect of the invention, the address generator includes (1) a first counter producing a value ICNT(t) which increments in response to the clock when a new unit a data is to be processed and resets in response to the clock when ICNT(t) reaches I, (2) a second counter producing a value MCNT(t) which increments in response to the clock when ICNT(t) is equal to I, and resets in response to the clock when MCNT(t) reaches M-1, and (3) a third counter which produces a value BCNT(t) which increments in response to the clock when MCNT(t) is equal to M-1, and resets in response to the clock when BCNT(t) reaches B-1, where B is equal to (1 cm (I)-1), where the 1 cm(n) is defined as a common multiple, and preferably the least common multiple of numbers in the set defined by (1, 2, . . ., n). The convolutional pattern comprises a convolutional interleaving pattern, and the sequence of addresses is computed according to a formula (or a logical equivalent thereof) for a current address ADDR as follows:

$$ADDR=M(BCNT(t)\bmod(ICNT(t)+1)+X(t))+MCNT(t),$$

where the factor X(t) is defined by X(t)=ICNT(t)+X(t-1), and X(t-1) is reset to zero in response to the clock when the value ICNT(t) equals I.

For a convolutional de-interleave function, the set of three counters is included, but the convolutional pattern is implemented by a sequence of addresses computed according to the formula (or a logical equivalent thereof) for a current address ADDR as follows:

$$ADDR=M(BCNT(t)\bmod(I-ICNT(t))+Y(t))+MCNT(t),$$

where the factor Y(t) is defined by Y(t)=Z(t-1), and Z(t)=(I-ICNT(t)+Z(t-1)), and Z(t-1) is reset to zero in response to the clock when the value ICNT(t) equals I, and is enabled where I-ICNT(t) is less than I after a first cycle for the de-interleave process.

According to other aspects of the invention, a communication channel processor is provided in which a stream of error protected packets is supplied to convolutional coder as discussed above. The communication channel processor includes an outer encoder, which implements an algorithm to create the error protected packets, such as a Reed-Solomon algorithm. Alternatively, the address generator produces a de-interleaving pattern, in which an outer decoder is coupled to the output of the memory, and decodes the stream of error protected packets to recover channel data.

Accordingly, the present invention provides a convolutional interleaver/de-interleaver architecture which is capable of utilizing a single port RAM, including a single address line for read and write. This saves logic space on the integrated circuit and allows ready scalability of the design. Furthermore, a programmable implementation is provided for a wide range of the I and M parameters. The architecture is suitable for very large I and M parameters, without modification. The circuit is programmable to act as an interleaver or a de-interleaver as suits the particular implementation required. Furthermore, a dramatic chip area reduction is provided for a wide range of I and M parameters.

Other aspects and advantages of the present invention can be seen upon review of the figures, the detailed description and the claims which follow.

DETAILED DESCRIPTION

A detailed description of the preferred embodiment of the present invention is provided with respect to FIGS. 4 to 8.

Figure 1:
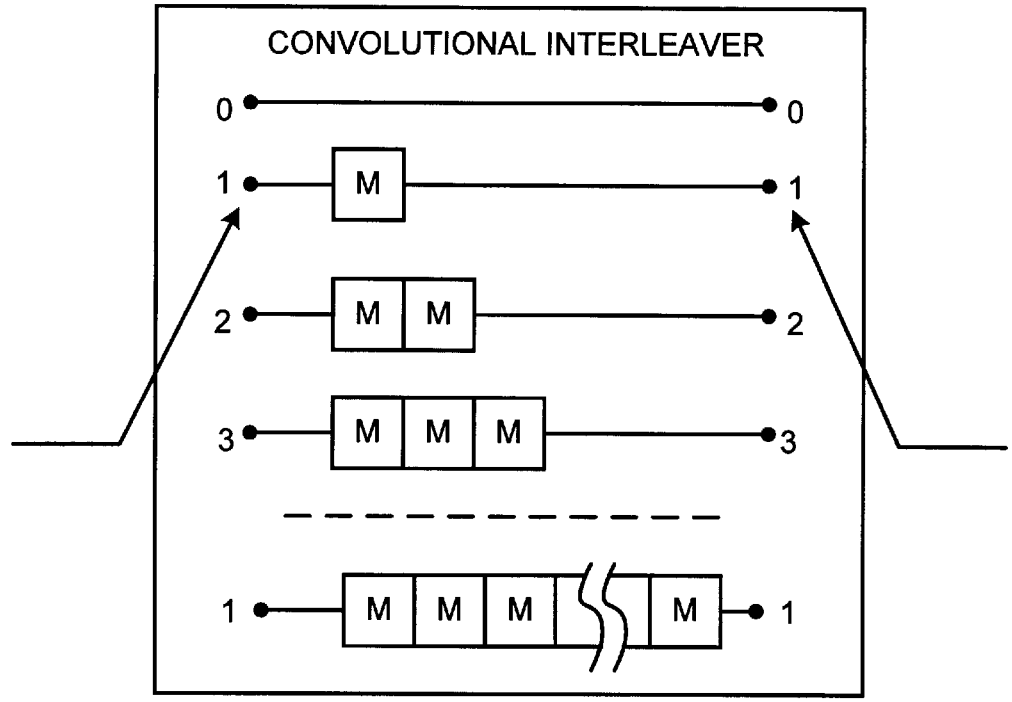
FIG. 1 is a schematic diagram illustrating convolutional interleaving according to the prior art.
Figure 2:
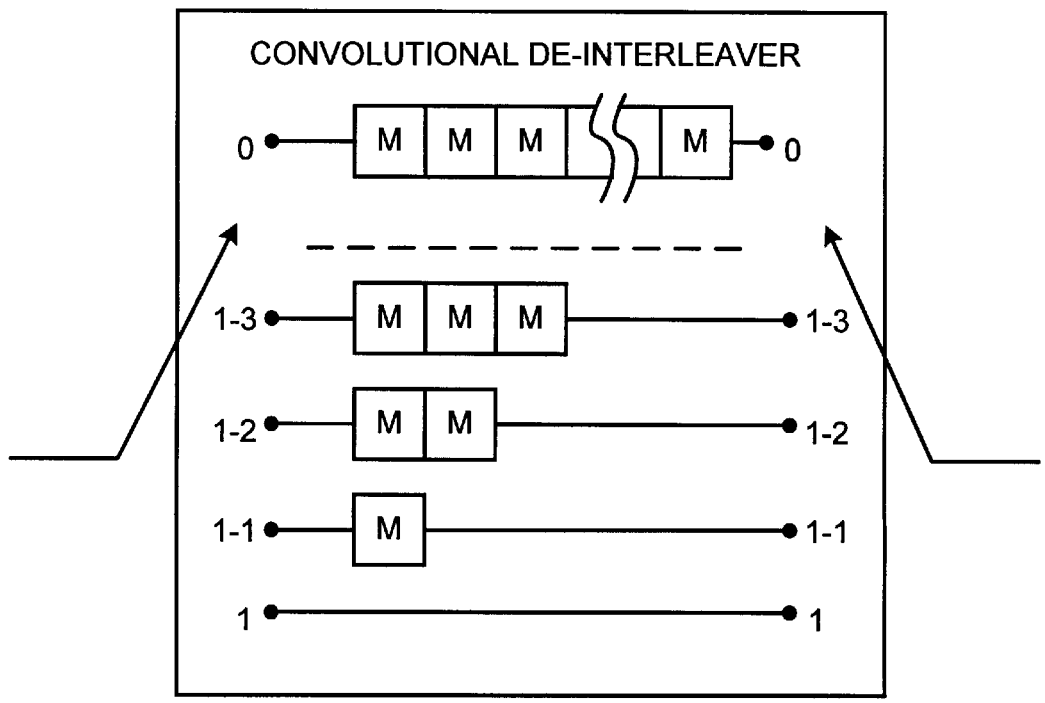
FIG. 2 is a schematic diagram illustrating convolutional de-interleaving according to the prior art.
Figure 3:
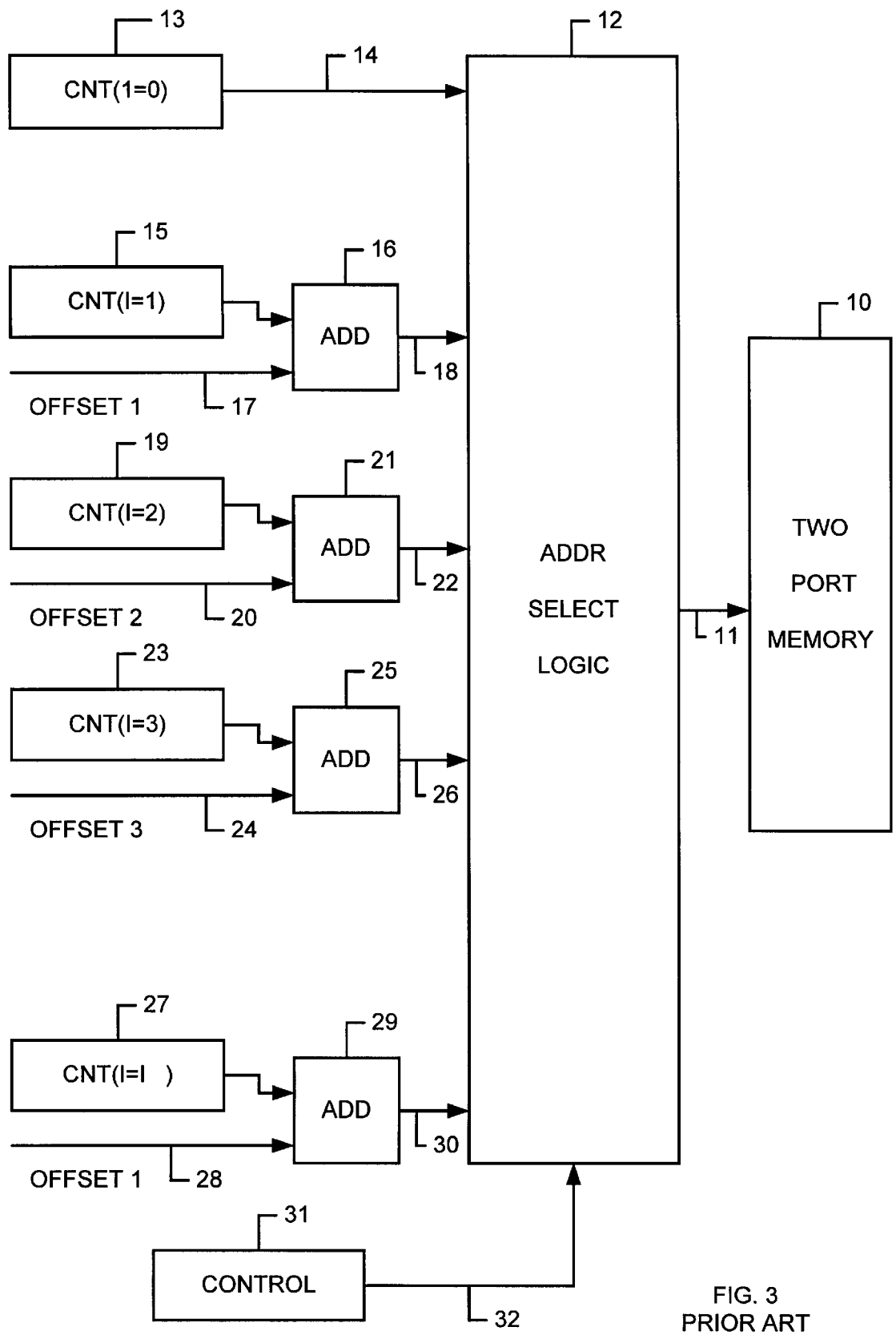
FIG. 3 is a block diagram of a typical prior art implementation for a convolutional de-interleaver or interleaver.
Figure 4:
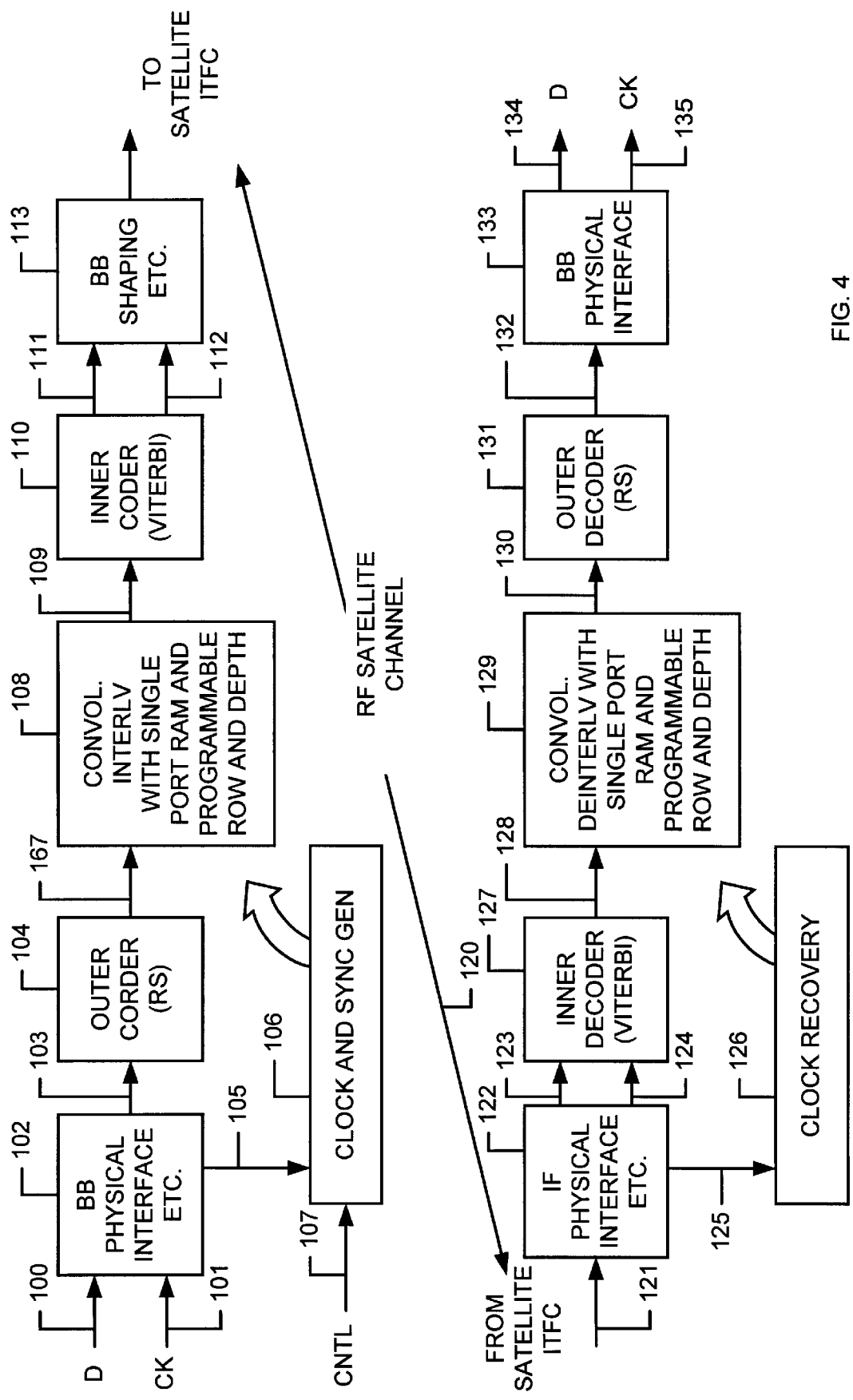
FIG. 4 illustrates a communication channel processor according to the present invention having a programmable convolutional coder using single port RAM.

FIG. 4 illustrates a context in which the convolutional de-interleaver/interleaver of the present invention is utilized. Thus, FIG. 4 provides as an example environment, a simplified block diagram of a digital broadcast system channel implemented according to the ETSI standard ETS 300 421. The channel receives data on line 100 and clock on line 101 in a base band interface circuit 102 which performs interfacing and other processes. The data is supplied from the interface 102 on line 103 to the outer coder 104. Also, information is supplied on line 105 to a clock and sync byte generator 106. A control signal on line 107 is used for code rate control according to the standard. The outer coder 104, according to preferred implementation, is a Reed-Solomon encoder and applies a Reed-Solomon code to received packets to produce an error protected packet on line 167. The error protected packet on line 167 is supplied to the convolutional interleaver 108 according to the present invention with a single port RAM and programmable row and cell depth numbers (I and M). The interleaved data is supplied on line 109 to an inner coder 110. According to preferred embodiment, the inner coder provides a Viterbi based channel encoding to improve error performance. The output of the inner decoder 110 is supplied on lines 111 and 112 to a base band shaping circuit 113 and other circuits used for coupling the signal to a satellite interface. The satellite transmission channel which may be subjected to interference causing burst type errors, transfers the data as represented by line 120 to an input 121 at the receiver. The input 121 is coupled to an intermediate frequency physical interface 122 and related circuitry, for recovering the inner coded signal on lines 123 and 124. Also, the physical interface 122 supplies signals on line 125 to clock recovery circuitry 126. The signals on lines 123 and 124 are supplied to an inner decoder 127, which decodes the Viterbi coding to recover the interleaved, error-protected packets on line 128. The packets on line 128 are supplied to convolutional de-interleaver 129, which according to the present invention includes a signal port RAM and a programmable address generator. The de-interleaved data is supplied on line 130 to the outer decoder 131, which applies the Reed-Solomon algorithms to recover the data packet on line 132. The data from line 132 is supplied to the base band physical interface 133 and other circuitry which provides the data output on line 134 and the CLK signal on line 135 to a system which utilizes the data.

Figure 5:
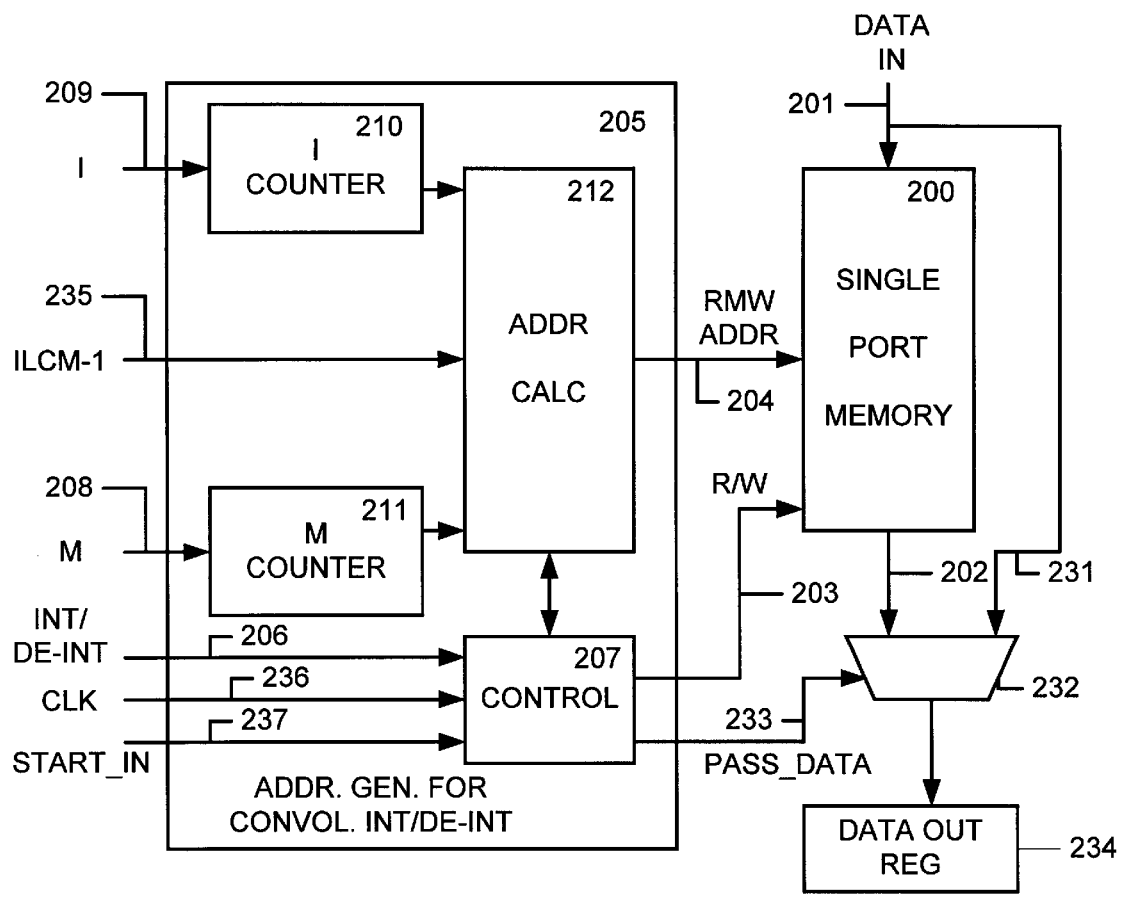
FIG. 5 is a basic logic diagram of the address generator and memory used for the convolutional coder of the present invention.

The convolutional interleaver 108 and convolutional de-interleaver 129 are implemented using a programmable circuit shown in the block diagram of FIG. 5. The circuit is based on a single port memory 200, which has a data input port 201, and a data output port 202. A read/write control signal is supplied on line 203 to the single port memory 200. A read/modify/write address is supplied on line 204 to the single port memory. The single port memory supports a read-modify-write operation, in which a memory location in the memory 200 identified by the address on line 204 is first read to supply the data on the output port 202, and then written with the data supplied on the input port 201, in response to a single address. Data input port 201 is also connected to bypass path 231, coupled as one input to bypass selector 232. The second input to bypass selector 232 is data output 202. The bypass selector 232 is controlled by the PASS_DATA signal on line 232. The output of selector 232 is supplied to an output, such as data output register 234.

The address on line 204 is supplied by the address generator for the convolutional interleaver/de-interleaver of the present invention, shown in block 205. The block 205 receives a control signal on line 206 which specifies to a control logic block 207 whether to operate in the interleave or de-interleave mode. The control signal on line 206 programs the circuit to perform either interleave or de-interleave functions. The signal on line 206 can change dynamically, altering the function of the circuit on the fly. Alternatively, the signal is stored in non-volatile memory on chip or programmed by a metal mask option or a fuse.

Also, input to the address generator 205 includes a programmable parameter M on line 208 which specifies the depth of the cells in the FIFOs being emulated, and a programmable parameter I on line 209, which specifies the number of rows in the convolutional coding being executed. The address generator 205 includes a first counter 210 which counts according to the I parameter, and a second counter 211 which counts according to the M parameter. The counters 210 and 211 supply an address calculation unit 212, which generates the read/write address on line 204 in response to the control 207.

Another parameter which is supplied in one alternative design is a parameter (ILCM−1) on line 235, preferably equal to the (1 cm (I)−1), defined above. In another alternative embodiment this value is calculated by the logic on chip. In an embodiment where I is 12, one less than the least common multiple of I is 27719. When I is 6, one less than the least common multiple of I is 59.

Other control signals supplied to control logic 207 include a clock on line 236 and a start signal on line 237.

By changing the programmable values I and M, the size of the interleaver/de-interleaver can be changed without changing the circuitry in the address calculation unit 212, limited only by the size of the counters 210 and 211. Furthermore, the use of single port memory 200 reduces the area consumed by the interleaver/de-interleaver circuitry, by as much as 30% over prior art dual port RAM embodiment.

Figure 6:
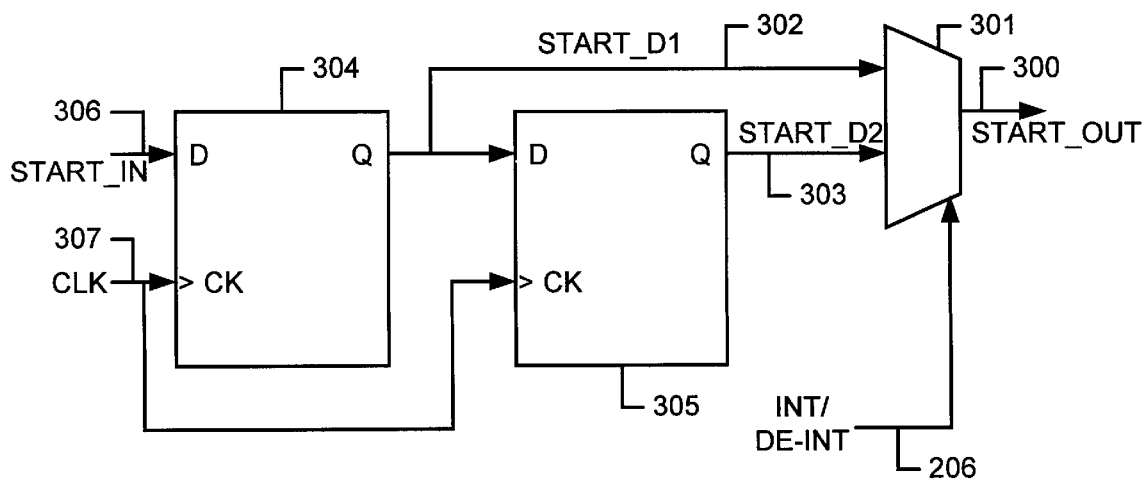
FIGS. 6, 7, and 8 are logic diagrams illustrating generation of control signals for convolutional coder of the present invention.

Detailed logic implementation of one preferred implementation of the programmable convolutional coder of the present invention is illustrated with respect to FIGS. 6 through 11. In FIG. 6, the generation of a control signal START_OUT. The START_OUT signal is supplied on line 300 at the output of a selector 301. The inputs to the selector 301 include the control signals START_D1 on line 302, and START_D2 on line 303. The signal START_D1 on line 302 is supplied at the output of register 304. The signal START_D2 on line 303 is supplied at the output of register 305. The input to register 304 includes the START_IN signal on line 306, corresponding to the control signal on line 237 of FIG. 5. Register 304 is clocked by the CLK signal on line 307, corresponding to the CLK signal on 236 of FIG. 5. The output of register 304 is also supplied as input to register 305. Register 305 is clocked by the CLK signal on line 307 and supplies the START_D2 on line 303. The selector 301 is controlled by the control signal on line 206, which indicates whether an interleave or de-interleave operation is selected for the current process. The START_OUT signal on line 300 is used in counter.

Figure 7:
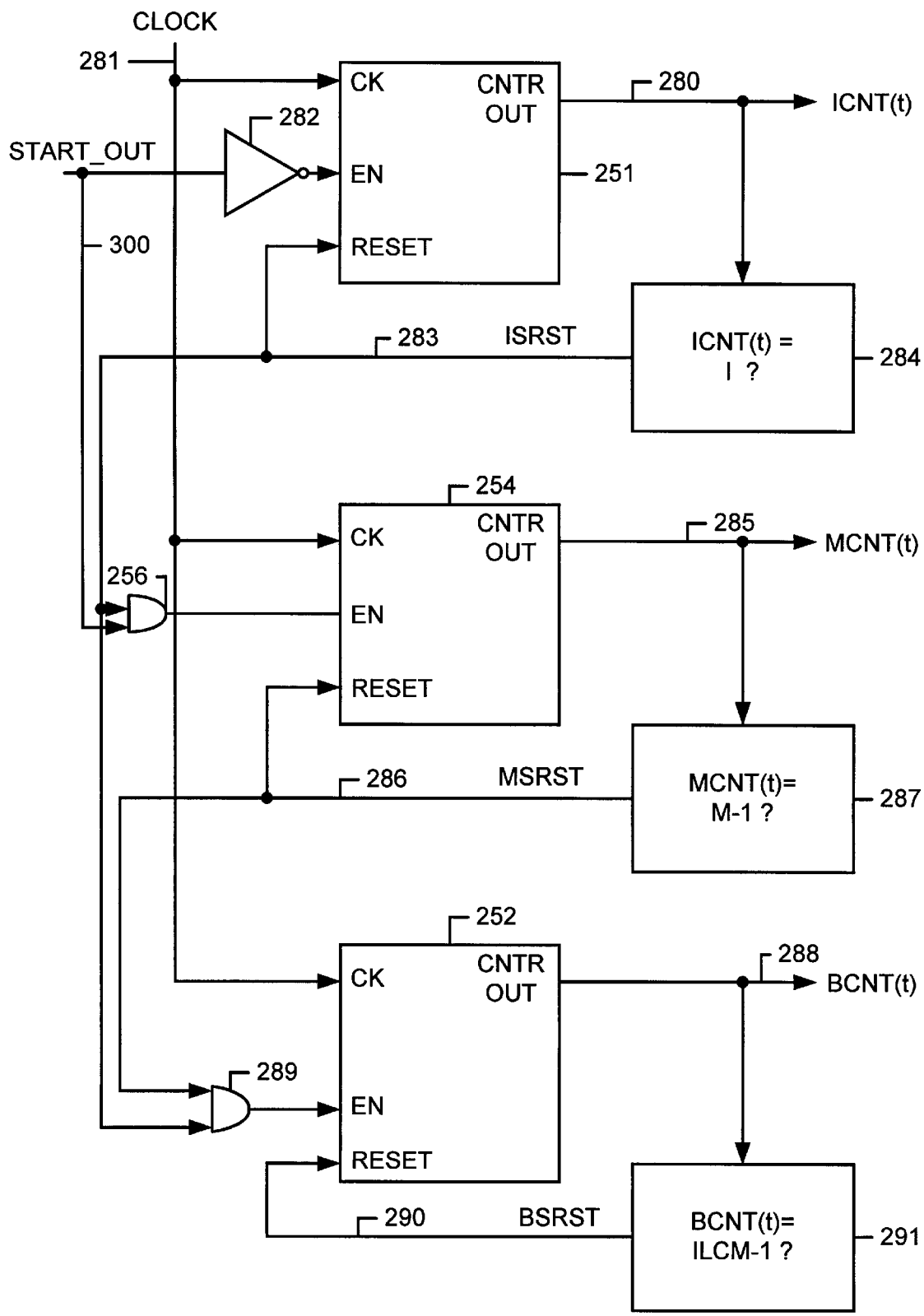

The counter control is illustrated in FIG. 7. The first counter 251 generates the value ICNT(t) on line 280. The first counter 251 is clocked by the CLK signal on line 281, corresponding to the CLK signal on line 307. It is enabled the output of invertor 282, which receives the START_OUT signal on line 300 on its input, and it is reset by the signal ISRST on line 283. The signal ISRST on line 283 is generated by block 284, which is true when the value ICNT(t) is equal to I. Thus, the first counter 251 counts from 0 to I, and repeats, in response to the clock.

The second counter 254 generates the signal MCNT(t) on line 285. The counter 254 is enabled by output of AND gate 256, having as inputs the START_OUT signal on line 300 and the ISRST signal on line 283. Counter 254 is clocked by the CLK signal on line 281. The counter 254 is reset by the signal MSRST on line 286, which is generated by the decoder 287. The decoder 287 generates a high output on line 286 when the value of MCNT(t) is equal to M−1.

The third counter 252 in FIG. 7 generates the value BCNT(t) on line 288. The counter 252 is clocked by the CLK signal on line 281, and enabled by the output of AND gate 289. The inputs to the AND gate 289 include the signal MSRST on line 286, and the signal ISRST on line 283. The counter 252 is reset by the signal BSRST on line 290, which is generated at the output of decoder 291. Decoder 291 generates a true output, when the signal BCNT(t) is equal to the parameter (ILCM−1), defined above.

Figure 8:
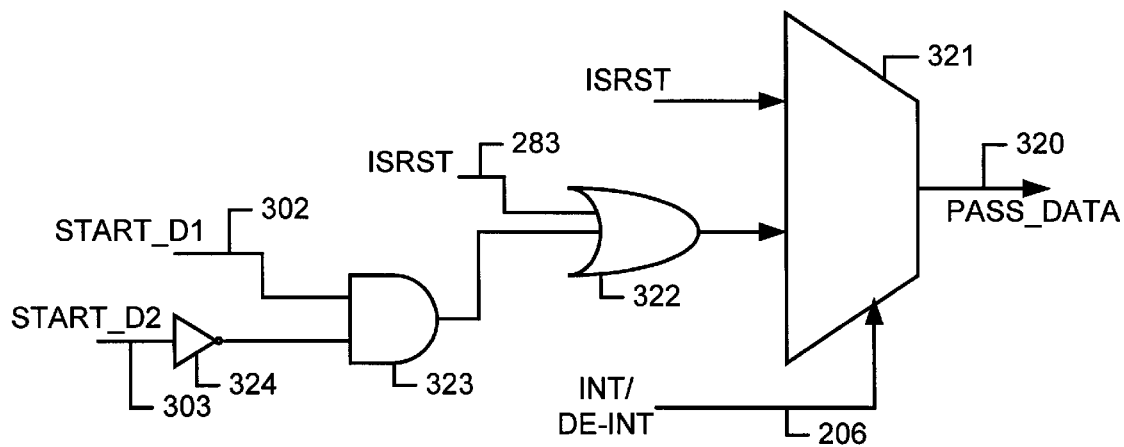

FIG. 8 illustrates generation of the control signal PASS_DATA on line 320, corresponding to the signal on line 233 of FIG. 5. The PASS_DATA signal on line 320 is generated at the output of selector 321. The inputs to the selector 321 include the signal ISRST on line 283, and the output OR gate 322. The inputs to OR gate 322 include the ISRST signal on line 283 and the output of AND gate 323. The inputs to the AND gate 323 include the signal START_D1 on line 302, and the output of invertor 324. The input to invertor 324 is the START_D2 signal on line 303.

Thus, the logic in FIG. 8 is used to generate the PASS_DATA signal, indicating that a incoming byte should bypass the memory in the coding process, corresponding to either the first row or the last row of the interleaver/de-interleaver construct as appropriate.

Figure 9:
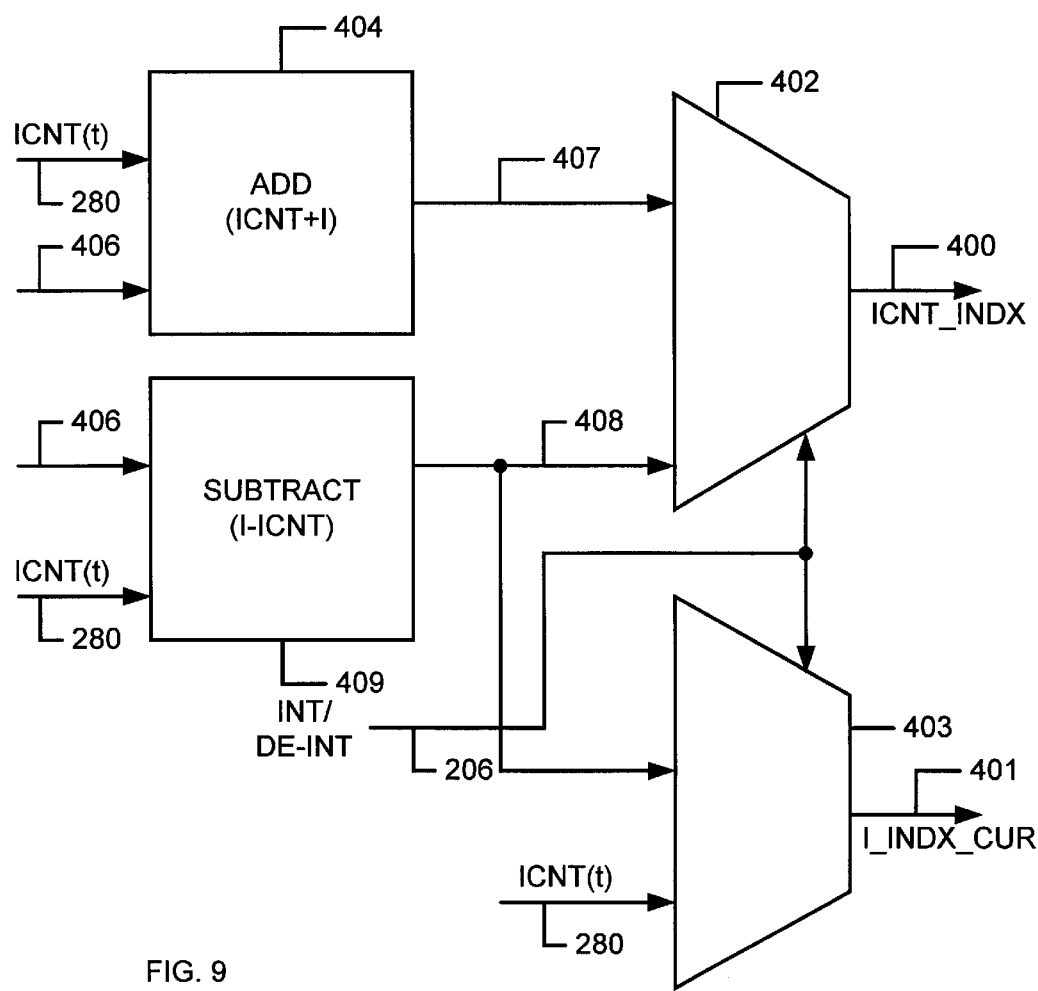
FIGS. 9 through 11 illustrate logic used for generation of read/modify/write addresses in the convolutional coder of the present invention.
Figure 10:
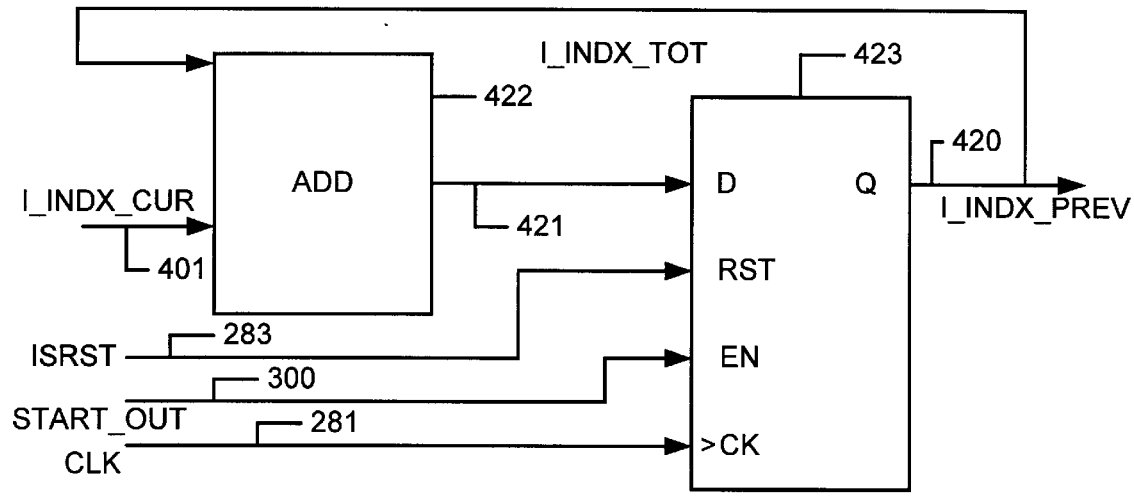
Figure 11:
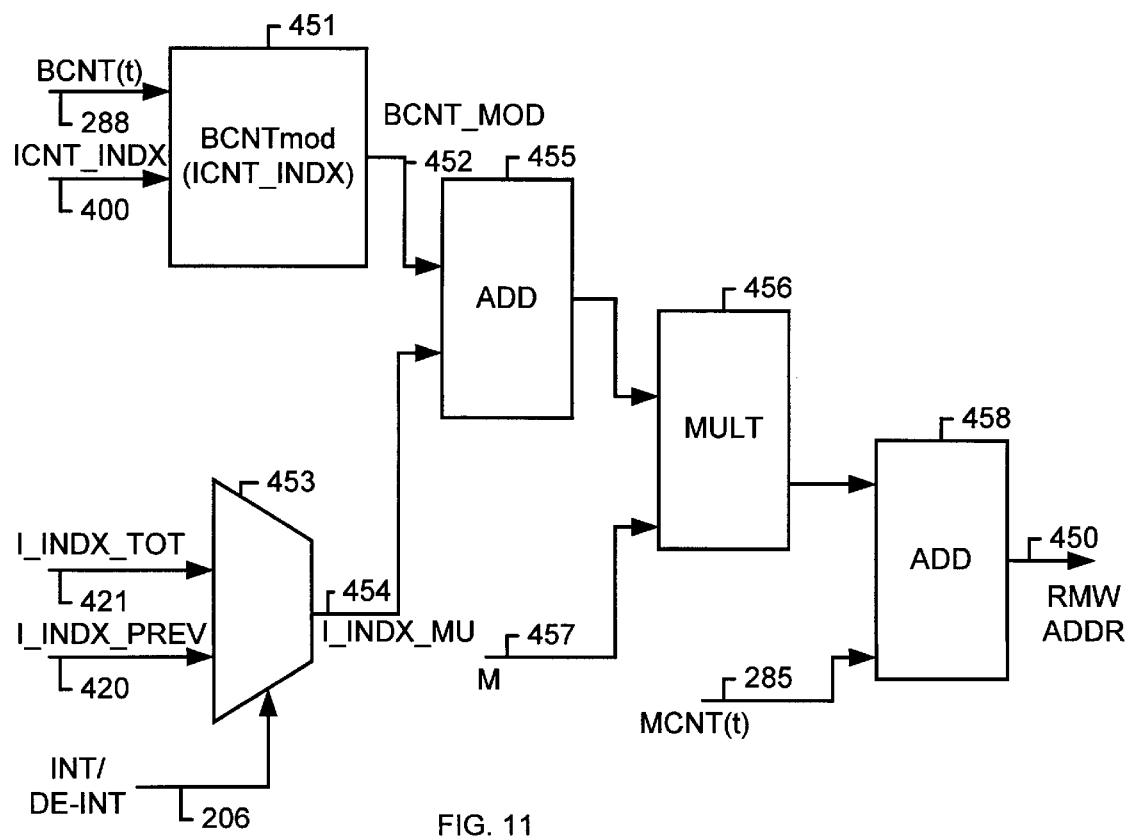

FIGS. 9 through 11 illustrate the logic used for calculation of the addresses on line 204 of system of FIG. 5. In FIG. 9, the generation of the logic parameters ICNT_INDX on line 400 and the I_INDX_CUR on line 401 is shown. These signals have different values depending on whether the circuit is in the interleave or de-interleave mode. Thus, the signal ICNT_INDX on line 400 is generated at the output of selector 402. Signal I_INDX_CUR on line 401 is generated at the output of selector 403. Selectors 402 and 403 are controlled by the control signal on line 206, indicating the interleave or the de-interleave mode. The inputs to selector 402 include the output of adder 404, which receives as inputs a signal ICNT(t) on line 280 and the parameter I on line 406. The output of adder 404 is supplied on line 407 to the selector 402. The second input to the selector 402 is the signal on line 408 generated at the output of the subtractor 409. The inputs to the subtractor 409 include the parameter I on line 406 and the value ICNT(t) on line 280. The inputs to the selector 403 include the signal on line 408 at the output of subtractor 409, and the parameter ICNT(t) on line 280.

FIG. 10 illustrates generation of the logic values I_INDX_PREV and I_INDX_TOT on lines 420 and 421, respectively. This is basically an accumulator circuit, based on adder 422. The input to the accumulator is the I_INDX_CUR signal on line 401. The parameter I_INDX_PREV on line 420 is fed back as a second input to the adder 422. The output of the adder 422 is supplied as the data input on line 421 to a register 423. Register 423 is clocked by the CLK signal on line 281. It is enabled by the START_OUT signal on line 300. The register on 423 is reset by the ISRST signal on line 283.

FIG. 11 illustrates the logic used for generating the read/modify/write address on line 450, which corresponds to the address signal on line 204 of FIG. 5. The logic includes a modulo arithmetic block 451. The inputs include the parameter ICNT_INDX on line 400 and the value BCNT(t) from line 288. The modulo arithmetic block 451 generates an output on 452 which is equal to the output of the BCNT(t) modulo ICNT_INDX. Also, as inputs the logic in FIG. 11 include the I_INDX_TOT from line 421, and the I_INDX_PREV signal on line 420. The signals on lines 420 and 421 are supplied to a selector 453. Selector 453 supplies one of the signals on its output, depending on the state of the control signal on line 206. In the interleave mode, the signal on line 421 is selected as output. In the de-interleave mode, the signal on line 420 is selected as output. The output of selector 453 is the selected index value on line 454. The signals on lines 452 and 454 are supplied as inputs to the adder 455. The output of adder 455 is supplied to a multiplier 456. The second input to the multiplier is the parameter M on line 457. The output of the multiplier 456 is supplied as a input to adder 458. The second input to the adder 458 is the output MCN(t) of the M counter from line 285. The output of the adder 458 is the read/modify/write address 450.

The logic operates in the interleave mode to produce a read/modify/write address according the formula (1) set out below:

$$ADDR=M(BCNT(t)\bmod(ICNT(t)+1)+X(t))+MCNT(t), \qquad (1)$$

where the factor X(t) is defined by X(t)=ICNT(t)+X(t−1), and

X(t−1) is reset to zero in response to the clock when the value ICNT(t) equals I.

The logic in the de-interleave mode generates a read/modify/write address according to formula (2) set out below:

$$ADDR=M(BCNT(t)\bmod(I-ICNT(t))+Y(t))+MCNT(t), \qquad (2)$$

where the factor Y(t) is defined by Y(t)=Z(t−1), and Z(t)=(I−ICNT(t)+Z(t−1)), and Z(t−1) is reset to zero in response to the clock when the value ICNT(t) equals I, and is enabled when (I−ICNT(t)) is less than I.

Formulas (1) and (2) have a variety of logical equivalents, which can also be utilized.

Accordingly, the present invention provides an architecture for a programmable convolutional interleaver/de-interleaver, suitable for implementation in an integrated circuit, and relying on single port memory. Thus, the circuit is scalable to a wide variety of the I and M parameters for the de-interleaver/interleaver algorithm, and uses much less space then prior art designs, particularly when the parameters I and M get large. The architecture is particularly suited to the communication channel processors, which use the convolutional interleaving and de-interleaving for the purposes of distributing their protected packets to minimize the impact of burst type errors in a communication channel, and particularly when the values I and M are greater than 10 each. For example, in a preferred system according to the ETS standard 300 421, I lies between 12 and 204, and M is 17 bytes or higher.

The programmable nature of the address generator according to the present invention is particularly important in environments where integrated circuits are being designed based on emerging standards, where the parameters I and M cannot be predicted with confidence required to implement them in silicon. Furthermore, the design is used for both interleaving and de-interleaving, allowing a single address generator to be used for both received and transmitted data.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus for convolutional coding of a stream of data, comprising:
    a coder input receiving the stream of data in time with a clock, the stream of data being supplied in units of data;
    a coder output;
    a memory having an address input, a data input coupled to the coder input and a data output coupled to the coder output; and
    an address generator, coupled with the clock, which supplies a sequence of addresses to the address input in time with the clock, according to a convolutional pattern having cells with a depth equal to a parameter M units of data and having a number of rows equal to a parameter I+1, and each row including i cells based on an index i going from 0 to I, including logic to provide the parameters M and I, and logic responsive to the specified parameters to calculate the sequence of addresses.

2. The apparatus of claim 1, wherein the logic to provide the parameter M includes a store coupled to the address generator which stores a value indicating the parameter specifying the depth M.

3. The apparatus of claim 1, wherein the logic to provide the parameter I includes a store coupled to the address generator which stores a value indicating the parameter I.

4. The apparatus of claim 1, wherein the logic to provide the parameters M and I includes a store coupled to the address generator which stores values indicating the parameters M and I.

5. The apparatus of claim 1, wherein the logic to provide the parameters M and I includes a programmable store coupled to the address generator which stores values indicating at least one of the parameters M and I.

6. The apparatus of claim 1, wherein the convolutional pattern comprises a convolutional interleaving pattern.

7. The apparatus of claim 1, wherein the convolutional pattern comprises a convolutional de-interleaving pattern.

8. The apparatus of claim 1, wherein the address generator includes
    a first counter producing a value ICNT(t) which increments in response to the clock when a new unit a data is to be processed and resets in response to the clock when ICNT(t) reaches I,
    a second counter producing a value MCNT(t) which increments in response to the clock when ICNT(t) is equal to I, and resets in response to the clock when MCNT(t) reaches M−1,
    a third counter which produces a value BCNT(t) which increments in response to the clock when MCNT(t) is equal to M−1, and resets in response to the clock when BCNT(t) reaches B−1, where B is equal to the least common multiple of a set defined as (1, 2, . . . ,I), and wherein
    the convolutional pattern comprises a convolutional interleaving pattern, and the sequence of addresses is computed according to a formula for a current address ADDR logically equivalent to the following:

$$ADDR = M(BCNT(t) \bmod (ICNT(t)+1) + X(t)) + MCNT(t),$$

where the factor X(t) is defined by X(t)=ICNT(t)+X(t−1), and X(t−1) is reset to zero in response to the clock when the value ICNT(t) equals I.

9. The apparatus of claim 1, wherein the address generator includes
    a first counter producing a value ICNT(t) which increments in response to the clock when a new unit a data is to be processed and resets in response to the clock when ICNT(t) reaches I,
    a second counter producing a value MCNT(t) which increments in response to the clock when ICNT(t) is equal to I, and resets in response to the clock when MCNT(t) reaches M−1,
    a third counter which produces a value BCNT(t) which increments in response to the clock when MCNT(t) is equal to M−1, and resets in response to the clock when BCNT(t) reaches B−1, where B is equal to a common multiple of set defined as (1, 2, . . . ,I), and wherein
    the convolutional pattern comprises a convolutional de-interleaving pattern, and the sequence of addresses is computed according to a formula for a current address ADDR as follows:

$$ADDR = M(BCNT(t) \bmod (I-ICNT(t)) + Y(t)) + MCNT(t),$$

where the factor Y(t) is defined by Y(t)=Z(t−1), and Z(t)=(I−ICNT(t)+Z(t−1)), and Z(t−1) is reset to zero in response to the clock when the value ICNT(t) equals I, and is enabled when (I−ICNT(t)) is less than I.

10. The apparatus of claim 8, wherein the common multiple consists of the least common multiple.

11. The apparatus of claim 9, wherein the common multiple consists of the least common multiple.

12. The apparatus of claim 1, including logic, having an interleave state and a de-interleave state, to operate the address generator according to a convolutional interleaving function in the interleave state and according to a convolutional de-interleaving function in the de-interleave state.

13. The apparatus of claim 12, wherein the address generator includes
    a first counter producing a value ICNT(t) which increments in response to the clock when a new unit a data is to be processed and resets in response to the clock when ICNT(t) reaches I,
    a second counter producing a value MCNT(t) which increments in response to the clock when ICNT(t) is equal to I, and resets in response to the clock when MCNT(t) reaches M−1,
    a third counter which produces a value BCNT(t) which increments in response to the clock when MCNT(t) is equal to M−1, and resets in response to the clock when BCNT(t) reaches B−1, where B is equal to a common multiple of a set defined as (1, 2, ... , I), and wherein in the interleave state the convolutional pattern comprises a convolutional interleaving pattern, and the sequence of addresses is computed according to a formula for a current address ADDR logically equivalent to the following:

$$ADDR=M*(BCNT(t)\bmod(ICNT(t)+1)+X(t))+MCNT(t),$$

where the factor X(t) is defined by X(t)=ICNT(t)+X(t−1), and X(t−1) is reset to zero in response to the clock when the value ICNT(t) equals I;

in the de-interleave state, the convolutional pattern comprises a convolutional de-interleaving pattern, and the sequence of addresses is computed according to a formula for a current address ADDR logically equivalent to the following:

$$ADDR=M*(BCNT(t)\bmod(I-ICNT(t)))+Y(t)+MCNT(t),$$

where the factor Y(t) is defined by Y(t)=Z(t−1), and Z(t)= (I−ICNT(t))+Z(t−1)), and Z(t−1) is reset to zero in response to the clock when the value ICNT(t) equals I, and is enabled when (I−ICNT(t)) is less than I.

14. The apparatus of claim 13, wherein the common multiple consists of the least common multiple.

15. A communication channel processor, comprising:
a packet input receiving a stream of error protected packets of data in time with a clock, the error protected packets including units of data;
a coder output;
a memory having an address input, a data input coupled to the packet input and a data output coupled to the coder output; and
an address generator, coupled with the clock, which supplies a sequence of addresses to the address input in time with the clock, according to a convolutional pattern having cells having a depth equal to M units of data and having a number of rows I+1, and each row including i cells based on an index i going from 0 to I, and including logic, having an interleave state and a de-interleave state, to operate the address generator according to a convolutional interleaving function in the interleave state and according to a convolutional de-interleaving function in the de-interleave state.

16. The communication channel processor of claim 15, including programmable memory coupled to the address generator which stores a value indicating the depth M, and logic responsive to the stored value to generate the sequence of addresses.

17. The communication channel processor of claim 15, including programmable memory coupled to the address generator which stores a value indicating the number of rows, and logic responsive to the stored value to generate the sequence of addresses.

18. The communication channel processor of claim 15, including programmable memory coupled to the address generator which stores a value indicating the number of rows, and a value indicating the depth M, and logic responsive to the stored values to generate the sequence of addresses.

19. The communication channel processor of claim 15, wherein the convolutional pattern comprises a convolutional interleaving pattern, and including:
a channel input receiving a stream of channel data; and
an outer encoder, connected between the channel input and the packet input, to encode a stream of channel data to generate the stream of error protected packets.

20. The communication channel processor of claim 19, wherein the outer encoder comprises a Reed-Solomon encoder.

21. The communication channel processor of claim 15, wherein the convolutional pattern comprises a convolutional de-interleaving pattern, and including:
a channel output; and
an outer decoder, connected between the data output of the memory and the channel output, to decode the stream of packet of error protected packets.

22. The communication channel processor of claim 21, wherein the outer decoder comprises a Reed-Solomon decoder.

23. The communication channel processor of claim 15, wherein the address generator includes
a first counter producing a value ICNT(t) which increments in response to the clock when a new unit a data is to be processed and resets in response to the clock when ICNT(t) reaches I,
a second counter producing a value MCNT(t) which increments in response to the clock when ICNT(t) is equal to I, and resets in response to the clock when MCNT(t) reaches M−1,
a third counter which produces a value BCNT(t) which increments in response to the clock when MCNT(t) is equal to M−1, and resets in response to the clock when BCNT(t) reaches B−1, where B is equal to the least common multiple of set defined as (1, 2, ... ,I), and wherein
the convolutional pattern in the interleave state comprises a convolutional interleaving pattern, and the sequence of addresses is computed according to a formula for a current address ADDR logically equivalent to the following:

$$ADDR=M(BCNT(t)\bmod(ICNT(t)+1)+X(t))+MCNT(t),$$

where the factor X(t) is defined by X(t)=ICNT(t)+X(t−1), and X(t−1) is reset to zero in response to the clock when the value ICNT(t) equals I.

24. The communication channel processor of claim 15, wherein the address generator includes
a first counter producing a value ICNT(t) which increments in response to the clock when a new unit a data is to be processed and resets in response to the clock when ICNT(t) reaches I,
a second counter producing a value MCNT(t) which increments in response to the clock when ICNT(t) is equal to I, and resets in response to the clock when MCNT(t) reaches M−1,
a third counter which produces a value BCNT(t) which increments in response to the clock when MCNT(t) is equal to M−1, and resets in response to the clock when BCNT(t) reaches B−1, where B is equal to the least common multiple of set defined as (1, 2, ... ,I), and wherein
the convolutional pattern in the de-interleave state comprises a convolutional de-interleaving pattern, and the sequence of addresses is computed according to a formula for a current address ADDR logically equivalent to the following:

$$ADDR=M(BCNT(t)\bmod(I-ICNT(t))+Y(t))+MCNT(t),$$

where the factor Y(t) is defined by Y(t)=Z(t−1), and Z(t)= (I−ICNT(t))+Z(t−1)), and Z(t−1) is reset to zero in response to the clock when the value ICNT(t) equals I.

25. The communication channel processor of claim 23, wherein the common multiplier consists of the least common multiplier.

26. The communication channel processor of claim 24, wherein the common multiple consists of the least common multiple.

27. The communication channel processor of claim 15, wherein the address generator includes a first counter producing a value ICNT(t) which increments in response to the clock when a new unit a data is to be processed and resets in response to the clock when ICNT(t) reaches I, a second counter producing a value MCNT(t) which increments in response to the clock when ICNT(t) is equal to I, and resets in response to the clock when MCNT(t) reaches M−1, a third counter which produces a value BCNT(t) which increments in response to the clock when MCNT(t) is equal to M−1, and resets in response to the clock when BCNT(t) reaches B−1, where B is equal to a common multiple of a set defined as (1, 2, . . . , I), and wherein in the interleave state the convolutional pattern comprises a convolutional interleaving pattern, and the sequence of addresses is computed according to a formula for a current address ADDR logically equivalent to the following:

$$ADDR=M*(BCNT(t) \bmod (ICNT(t)+1)+X(t))+MCNT(t),$$

where the factor X(t) is defined by X(t)=ICNT(t)+X(t−1), and X(t−1) is reset to zero in response to the clock when the value ICNT(t) equals I;

in the de-interleave state, the convolutional pattern comprises a convolutional de-interleaving pattern, and the sequence of addresses is computed according to a formula for a current address ADDR logically equivalent to the following:

$$ADDR=M*(BCNT(t) \bmod (I-ICNT(t)))+Y(t)+MCNT(t),$$

where the factor Y(t) is defined by Y(t)=Z(t−1), and Z(t)=(I−ICNT(t))+Z(t−1)), and Z(t−1) is reset to zero in response to the clock when the value ICNT(t) equals I, and is enabled when (I−ICNT(t)) is less than I.

28. The communication channel processor of claim 27, wherein the common multiple consists of the least common multiple.

29. A communication channel processor, comprising:

a channel input receiving a stream of channel data; and a Reed-Solomon encoder, having an input coupled to the channel input, and having an encoder output, to encode the stream of channel data to generate a stream of error protected packets;

a channel output;

a memory having an address input, a data input coupled to the encoder output and a data output coupled to the channel output, and supporting read-modify-write operations in time with the clock, the read-modify-write operations operating at a memory location identified by an address on the address input to supply a unit of data read from the memory location to the data output, and supply a unit of data from the data input to the memory location;

an address generator, coupled with the clock, which supplies a sequence of addresses to the address input in time with the clock, according to a convolutional pattern having cells having a depth equal to M units of data and having a number of rows I+1, and each row including i cells based on an index i going from 0 to I;

programmable memory coupled to the address generator which stores a value specifying the number of rows, and a value specifying the depth M, and logic responsive to the stored values to generate the sequence of addresses; and wherein the logic responsive to the stored values includes a first counter producing a value ICNT(t) which increments in response to the clock when a new unit a data is to be processed and resets in response to the clock when ICNT(t) reaches I, a second counter producing a value MCNT(t) which increments in response to the clock when ICNT(t) is equal to I, and resets in response to the clock when MCNT(t) reaches M−1, a third counter which produces a value BCNT(t) which increments in response to the clock when MCNT(t) is equal to M−1, and resets in response to the clock when BCNT(t) reaches B−1, where B is equal to the least common multiple of a set defined as (1, 2, . . . , I), and wherein the convolutional pattern comprises a convolutional interleaving pattern, and the sequence of addresses is computed according to a formula for a current address ADDR logically equivalent to the following:

$$ADDR=M(BCNT(t) \bmod (ICNT(t)+1)+X(t))+MCNT(t),$$

where the factor X(t) is defined by X(t)=ICNT(t)+X(t−1), and X(t−1) is reset to zero in response to the clock when the value ICNT(t) equals I.

30. A communication channel processor, comprising:

a channel input receiving a stream of channel data including error protected packets; and a channel output;

a memory having an address input, a data input coupled to the encoder output and a data output coupled to the channel output, and supporting read-modify-write operations in time with the clock, the read-modify-write operations operating at a memory location identified by an address on the address input to supply a unit of data read from the memory location to the data output, and supply a unit of data from the data input to the memory location;

a Reed-Solomon decoder, having an input coupled to the data output of the memory, and having an decoder output coupled to the channel output, to decode the stream of error protected packets to recover channel data;

an address generator, coupled with the clock, which supplies a sequence of addresses to the address input in time with the clock, according to a convolutional pattern having cells having a depth equal to M units of data and having a number of rows I+1, and each row including i cells based on an index i going from 0 to I;

programmable memory coupled to the address generator which stores a value specifying the number of rows, and a value specifying the depth M, and logic responsive to the stored values to generate the sequence of addresses; and wherein the logic responsive to the stored values includes a first counter producing a value ICNT(t) which increments in response to the clock when a new unit a data is to be processed and resets in response to the clock when ICNT(t) reaches I, a second counter producing a value MCNT(t) which increments in response to the clock when ICNT(t) is equal to I, and resets in response to the clock when MCNT(t) reaches M−1, a third counter which produces a value BCNT(t) which increments in response to the clock when MCNT(t) is equal to M−1, and resets in response to the clock when BCNT(t) reaches B−1, where B is equal to the least common multiple of a set defined as (1, 2, . . . , I), and wherein the convolutional pattern comprises a convolutional de-interleaving pattern, and the sequence of addresses is computed according to a formula for a current address ADDR logically equivalent to the following:

$$ADDR=M(BCNT(t) \bmod (I-ICNT(t))+Y(t))+MCNT(t),$$

where the factor Y(t) is defined by Y(t)=Z(t−1), and Z(t)=(I−ICNT(t))+Z(t−1)), and Z(t−1) is reset to zero in response to the clock when the value ICNT(t) equals I.

* * * * *